United States Patent
Lindquist et al.

(10) Patent No.: US 8,802,965 B2
(45) Date of Patent: Aug. 12, 2014

(54) PLASMONIC NANOCAVITY DEVICES AND METHODS FOR ENHANCED EFFICIENCY IN ORGANIC PHOTOVOLTAIC CELLS

(75) Inventors: Nathan C. Lindquist, St. Paul, MN (US); Wade A. Luhman, Shakopee, MN (US); Russell J. Holmes, Minneapolis, MN (US); Sang-Hyun Oh, Plymouth, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 276 days.

(21) Appl. No.: 12/586,383

(22) Filed: Sep. 21, 2009

(65) Prior Publication Data

US 2010/0206380 A1    Aug. 19, 2010

Related U.S. Application Data

(60) Provisional application No. 61/192,563, filed on Sep. 19, 2008.

(51) Int. Cl.
   *H01L 31/00*     (2006.01)

(52) U.S. Cl.
   USPC .......................................................... 136/243

(58) Field of Classification Search
   USPC ................................................ 136/243–265
   See application file for complete search history.

(56) References Cited

U.S. PATENT DOCUMENTS

| | | | | |
|---|---|---|---|---|
| 4,112,457 A | * | 9/1978 | D'Aiello | 136/255 |
| 6,441,298 B1 | * | 8/2002 | Thio | 136/250 |
| 2005/0236033 A1 | * | 10/2005 | Lawandy | 136/252 |
| 2005/0269578 A1 | * | 12/2005 | Barnes et al. | 257/81 |
| 2007/0194357 A1 | * | 8/2007 | Oohashi et al. | 257/292 |
| 2007/0289623 A1 | * | 12/2007 | Atwater | 136/252 |
| 2010/0006144 A1 | * | 1/2010 | Baumberg et al. | 136/255 |
| 2010/0175745 A1 | * | 7/2010 | Kostecki et al. | 136/255 |

OTHER PUBLICATIONS

Reilly et al "Surface-Plasmon Enhanced Transparent Electrodes in Organic Photovoltaics", Applied Physics Letters vol. 92, pp. 2433304-1-243304-3 (2008), published on lines Jun. 17, 2008.*
Pillai et al "Surface Plasmon Enhanced Silicon Solar Cells", Journal of Applied Physics, vol. 101 pp. 093105-1-093105-8 (2007), published online May 7, 2007.*
Lindquist et al "Plasmonic Nanocavity Arrays for Enhanced Efficiency in Organic Photovoltaic Cells", Applied Physics Letters, vol. 93 pp. 123308-1-123308-3, (2008), published online Sep. 23, 2008.*
Ishi et al "Si Nano-Photodiode with a Surface Plasman Antenna", Japanenese Journal of Applied Physcis, vol. 44, No. 12, pp. L364-L366 (2005).*
Heidel et al "Surface Plasmon Polariton Mediated Energy Transfer in Organic Photovoltaic Devices" applied Physcis Letters vol. 91, pp. 093506-1-093506-3 (2007) published online Aug. 28, 2007.*
Gong et al "Desing of Plasmon Cavities for Solid-State Cavity Quantum Electrodynamics Applications" Applied Physics Letters vol. 90 pp. 033133-1-033133-2 (2007) published online Jan. 18, 2007.*

(Continued)

*Primary Examiner* — Alexander Kollias
(74) *Attorney, Agent, or Firm* — Kagan Binder, PLLC

(57) ABSTRACT

Plasmonic nanocavity arrays and methods for enhanced efficiency in organic photovoltaic cells are described. Plasmonic nanocavities offer a promising and highly tunable alternative to conventional transparent conductors for photovoltaic applications using both organic and inorganic materials systems.

6 Claims, 15 Drawing Sheets

(56) References Cited

OTHER PUBLICATIONS

Genet et al "Light in Tiny Holes", Nautre vol. 445, pp. 39-46 Jan. 4, 2007.*

Astilean et al., "Light transmission through metallic channels much smaller than the wavelength," *Optics Communications* 175 (2000) pp. 265-273, Mar. 1, 2000.

Barnes et al., "Surface Plasmon subwavelength optics", *Nature*, vol. 424, pp. 824-830, Aug. 14, 2003.

Collin et al., "Efficient light absorption in metal-semiconductor-metal nanostructures," *Applied Physics Letters*, vol. 85, No. 2, pp. 194-196, Jul. 12, 2004.

Ebbesen et al., "Extraordinary optical transmission through subwavelength hole arrays," *Nature*, vol. 391, pp. 667-669, Feb. 12, 1998.

Gaudiana et al., "Fantastic plastic," *Nature photonics*, vol. 2, pp. 287-289, May 2008.

Gregg, "The Photoconversion Mechanism of Excitonic Solar Cells," *MRS Bulletin*, vol. 30, pp. 20-22, Jan. 2005.

Halls et al., "Efficient photodiodes from interpenetrating polymer networks," *Nature*, vol. 376, pp. 498-500, Aug. 10, 1995.

Heidel et al., "Surface Plasmon polariton mediated energy transfer in organic photovoltaic devices," *Applied Physics Letters* 91, pp. 093506-1-0903506-3, 2007.

Hutley et al., "The Total Absorption of Light by a Diffraction Grating," *Optics Communications*, vol. 19, No. 3, pp. 431-436, Dec. 1976.

Lim et al., "Photocurrent spectroscopy of optical absorption enhancement in silicon photodiodes via scattering from surface plasmon polaritons in gold nanoparticles," *Journal of Applied Physics* 101, pp. 140309-1-104309-7, 2007.

Miyazaki, "Squeezing Visible Light Waves into a 3-nm-Thick and 55-nm-Long Plasmon Cavity," *Physical Review Letters* 96, pp. 097401-1-097401-4, Mar. 10, 2006.

Morfa et al., "Plasmon-enhanced solar energy conversion in organic bulk heterojunction photovoltaics," *Applied Physics Letters* 92, pp. 013504-1-013504-3, 2008.

Peumans et al., "Efficient bulk heterojunction photovoltaic cells using small-molecular-weight organic thin films," *Nature*, vol. 425, pp. 158-162, Sep. 11, 2003.

Peumans et al., "Small molecular weight organic thin-film photodetectors and solar cells," *Journal of Applied Physics*, vol. 93, No. 7, pp. 3693-3723, Apr. 1, 2003.

Pillai et al., "Surface plasmon enhanced silicon solar cells," *Journal of Applied Physics* 101, pp. 093105-1-093105-8, 2007.

Rand et al., "Long-range absorption enhancement in organic tandem thin-film solar cells containing silver nanoclusters," *Journal of Applied Physics*, vol. 96, No. 12, pp. 7519-7526, Dec. 15, 2004.

Rand et al., "Organic Double-Heterostructure Photovoltaic Cells Employing Thick Tris(acetylacetonato)ruthenium(III) Exciton-Blocking Layers," *Advanced Materials* 2005, pp. 2714-2718, 2005.

Ritchie, "Plasma Losses by Fast Electrons in Thin Films," *Physical Review*, vol. 106, No. 5, pp. 874-881, Jun. 1, 1957.

Schaadt et al., "Enhanced semiconductor optical absorption via surface Plasmon excitation in metal nanoparticles," *Applied Physics Letters* 86, pp. 063106-1-063106-4, 2005.

Shaheen et al., "Organic-Based Photovoltaics: Toward Low-Cost Power Generation," *MRS Bulletin*, vol. 30, pp. 10-19, Jan. 2005.

Shao et al., "Efficient Organic Heterojunction Photovoltaic Cells Based on Triplet Materials," *Advanced Materials* 2005, vol. 17, pp. 2841-2844, 2005.

Shin et al., "Omnidirectional resonance in a metal-dielectric-metal geometry," *Applied Physics Letters*, vol. 84, No. 22, pp. 4421-4423, May 2004.

Stenzel et al., "Enhancement of the photovoltaic conversion efficiency of copper phthalocyanine thin film devices by incorporation of metal clusters," *Solar Energy Materials and Solar Cells* 37, pp. 337-348, 1995.

Teperik et al., "Omnidirectional absorption in nanostructured metal surfaces," *Nature photonics*, vol. 2, pp. 299-301, May 2008.

Tvingstedt et al., "Surface Plasmon increase absorption in polymer photovoltaic cells," *Applied Physics Letters* 91, pp. 113514-1-113514-3, 2007.

Westphalen et al., "Metal cluster enhanced organic solar cells," *Solar Energy Materials &Solar Cells* 61, pp. 97-105, 2000.

Xue et al., "A Hybrid Planar-Mixed Molecular Heterojunction Photovoltaic Cell," *Advanced Materials* 2005, 17, No. 1, pp. 66-71, Jan. 6, 2005.

Yu et al., "Polymer Photovoltaic Cells Enhanced Efficiencies via a Network of Internal Donor-Acceptor Heterojunctions," *Science*, vol. 270, pp. 1789-1791, Dec. 15, 1995.

Zia et al., "Geometries and materials for subwavelength surface plasmon modes," *J. Opt. Soc. Am. A*, vol. 21, No. 12, pp. 2442-2446, Dec. 2004.

* cited by examiner

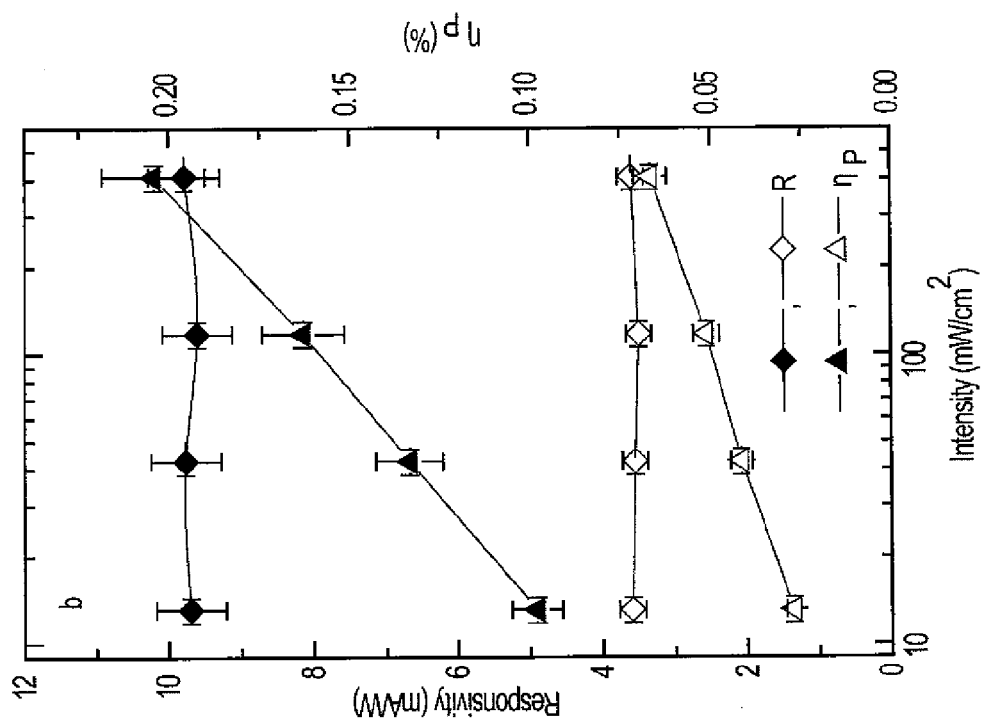
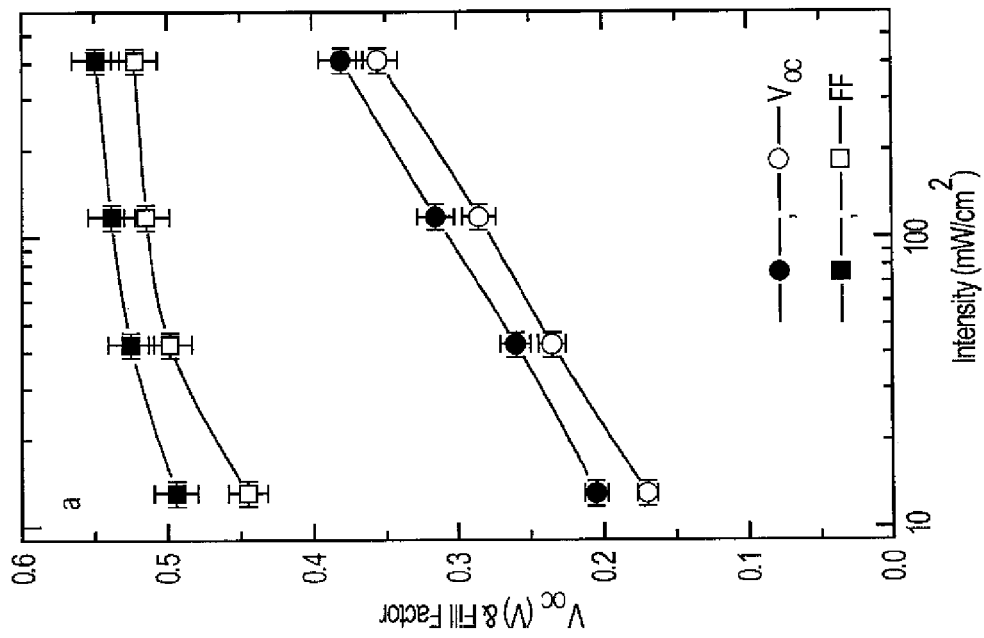
Fig. 8
Fig. 7

PLASMONIC NANOCAVITY DEVICES AND METHODS FOR ENHANCED EFFICIENCY IN ORGANIC PHOTOVOLTAIC CELLS

CROSS REFERENCE TO RELATED APPLICATIONS

The present application claims the benefit of U.S. Provisional Application No. 61/192,563 filed Sep. 19, 2008, the entire contents of which is incorporated herein by reference for all purposes.

TECHNICAL FIELD

The present invention relates generally to semiconductor devices. More particularly, the present invention relates to organic photovoltaic semiconductor devices. Devices of the present invention are particularly useful in solar cells, for example.

BACKGROUND

Organic semiconductors are attractive for use in organic photovoltaic cells (OPVs) due to the potential for low-cost, high-throughput processing. While promising, limitations in the absorption efficiency must be addressed to improve OPV power conversion efficiency. In an OPV the absorption of light excites an electron from the highest occupied molecular orbital (HOMO) to the lowest unoccupied molecular orbital (LUMO) as schematically illustrated in FIG. 1. These are analogous to the conduction band and valence band in inorganic semiconductors. This electron remains bound to the positively charged hole in the HOMO level by Coulombic forces. The bound electron-hole pair is electrically neutral and is typically referred to as an exciton. In order to extract power from the OPV this exciton is separated into its constituent electron and hole, which can then be collected at the cathode and anode respectively.

Exciton dissociation in an OPV is realized using a heterojunction. A heterojunction is an interface between two organic materials with offset HOMO and LUMO levels. The material with the higher LUMO level is typically referred to as the electron donor, while the material with the lower LUMO level is typically referred to as the electron acceptor. The donor-acceptor (DA) interface will dissociate an exciton if the energy level offsets between the donor and acceptor are greater than the exciton binding energy, thus providing a path for electron relaxation through exciton dissociation. These materials are also the active optical absorbing materials in an OPV. As the excitons are created throughout the donor and acceptor layers they must diffuse to the DA interface in order to be dissociated into charge carriers. Typical exciton diffusion lengths for organic materials range from 3-40 nm.

One limitation in OPVs is that the exciton diffusion length (LD~10 nm) of the active materials is much shorter than the optical absorption length (LA~100 nm), leading to necessarily thin absorbing layers. The optical absorption length is defined when the ratio of the transmitted light intensity over the incident light intensity is equal to $\exp(-1)$. The short LD of organic materials has lead to new design schemes for OPVs, such as using bulk heterojunctions (BHJ), planar-mixed layers and phosphorescent materials. Bulk heterojunctions and planar-mixed layers are device architectures that increase the amount of DA contact area by using interpenetrating networks, while maintaining continuous material pathways for charge collection. The interpenetrating network allows for an increased number of dissociation sites, reducing the distance an exciton must travel for dissociation. For most small molecule OPVs the interpenetrating network is achieved by thermally depositing two materials simultaneously, creating a mixture. In polymeric OPVs this morphology can be achieved by solution deposition of one blended layer that contains both the donor and acceptor materials.

Phosphorescent materials typically have a longer LD than their fluorescent counterparts due to their increased exciton lifetime. Exciton lifetimes in phosphorescent materials are typically longer than fluorescent materials due to their less favorable optical transitions back to the ground state. Advances that exploit BHJs have generated OPV efficiencies exceeding 4%.

SUMMARY

The present invention approaches the short diffusion length limitation in a different manner. Instead of modifying the device architecture to increase exciton dissociation, the present invention increases absorption in the thin active organic semiconducting layers. The absorption is increased through the use of surface plasmons and a plasmonic nanocavity, where more excitons are generated within a diffusion length of the DA interface and can contribute to photocurrent, therefore increasing device efficiency.

Surface plasmons are electromagnetic surface waves confined to a metal-dielectric interface by coupling to the free electron plasma in metals. Due to their evanescent nature, SP waves are not limited by the diffraction limit, and can provide confinement of light on scales much smaller than the free-space wavelength. The possibility of subwavelength confinement and control of optical fields has generated intense interest in the rapidly developing field of plasmonics. The present invention uses the confinement of optical fields in plasmonic nanocavity arrays, thereby allowing the use of thin OPV layers without sacrificing optical absorption potential.

Plasmonic photovoltaic structures have been examined previously in the context of dispersed metallic nanoparticles, increasing absorption in OPVs. While promising, the field enhancement from metallic nanoparticles is relatively short-range, difficult to tune, and their presence can quench the excitons. In the present invention a different approach is used that combines local SP field enhancement and strong plasmonic nanocavity modes by replacing the anode of an OPV cell with a nanostructured silver grating. The patterned anode, the OPV layers, and the cathode define a metal-insulator-metal (MIM) stack, a highly tunable structure that can offer deep subwavelength confinement and high field enhancement. To increase the free-space coupling, a periodic array of such MIM nanocavities can be used.

The present invention provides OPV cells integrated with plasmonic nanocavities that combine field enhancement, tunable spectral response, and increased overall power conversion efficiency. Plasmonic nanocavity arrays for high-performance solar cells, organic or otherwise, are provided, thus allowing the use of thin active layers without sacrificing optical absorption potential.

BRIEF DESCRIPTION OF THE DRAWINGS

The accompanying drawings, which are incorporated in and constitute a part of this disclosure, illustrate several aspects of the present invention and together with description of the exemplary embodiments serve to explain the principles of the present invention. A brief description of the drawings is as follows:

FIG. 7 is a graph that shows the photovoltaic response under simulated solar illumination of an exemplary device in accordance with the present invention. Agreement of the open-circuit voltage (circles) and fill factor (FF, squares) between the patterned device (filled symbols) and unpatterned device (open symbols) indicates that the patterned anode does not adversely affect transport and charge collection in the device.

FIG. 8 is a graph that also shows the photovoltaic response under simulated solar illumination of an exemplary device in accordance with the present invention. The large increase in responsivity (R, diamonds) for the patterned device (filled symbols) compared to the unpatterned device (open symbols) provides a 3.2±0.4 fold increase in power conversion efficiency (triangles) at 118±12 mW/cm2 illumination.

DETAILED DESCRIPTION

Figure 1:
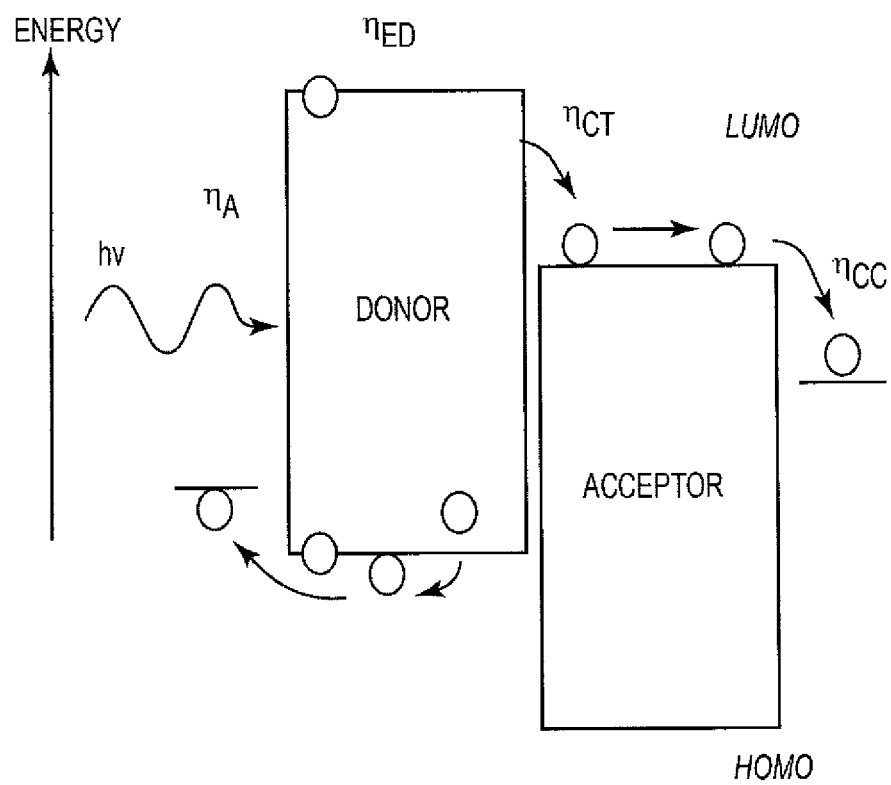
FIG. 1 is a schematic view of device operation in an organic solar cell. Starting with light absorption (ηA), followed by exciton diffusion (ηED), charge transfer (ηCT), and charge collection (ηCC).

The exemplary embodiments of the present invention described herein are not intended to be exhaustive or to limit the present invention to the precise forms disclosed in the following detailed description. Rather the exemplary embodiments described herein are chosen and described so those skilled in the art can appreciate and understand the principles and practices of the present invention.

Organic semiconductors are attractive as active media in photovoltaic cells due to the potential for high-throughput processing and compatibility with inexpensive, flexible substrates. While progress in organic photovoltaic cell (OPV) development has been significant, fundamental limitations relating to device absorption efficiency remain to be addressed to realize significant gains in power conversion efficiency.

Optical absorption in an organic semiconductor results in the creation of a tightly bound exciton. The exciton diffuses to an electron donor-acceptor heterojunction where the exciton is dissociated to generate a photocurrent. Typically, OPVs comprise thin active layers because the exciton diffusion length (LD~10 nm) is much shorter than the optical absorption length (LA~100 nm). Several device architectures have been exploited to overcome the short LD, including bulk and planar-mixed heterojunctions, and the use of long LD phosphorescent materials.

The present invention overcomes the short LD by incorporating the OPV into a plasmonic nanocavity array. Surface plasmons are electromagnetic surface waves coupled to the free electron plasma in metals and confined to a metal-dielectric interface. The plasmonic nanocavity exploits the coupling between surface plasmons in one or both of a nanopatterned metallic anode and a metallic cathode.

Devices in accordance with the present invention trap and manipulate incident light, leading to the excitation of surface plasmon resonances and high absorption. The use of a plasmonic nanocavity in accordance with the present invention in an exemplary OPV can provide a significant increase in device power conversion efficiency compared to a similar device having an unpatterned metallic anode. For example, in one exemplary embodiment, a 3.2±0.4 fold increase in device power conversion efficiency compared to a similar device having an unpatterned metallic anode under AM1.5G simulated solar illumination can be provided.

Plasmonic waveguides and cavities, such as metal-insulator-metal (MIM) stacks or metal-semiconductor-metal (MSM) gratings can provide significant optical field confinement and resonant absorption. Although any subwavelength metallic structure can generate surface plasmons, one preferred technique includes surface plasmon-mediated enhanced light transmission through periodic subwavelength aperture arrays. The periodic array acts as a grating coupler providing the necessary momentum matching between incident photons and the surface plasmon modes, resonantly enhancing the surface plasmon field, and the overall transmission. Similarly, periodically arranged plasmonic MIM nanocavities (a plasmonic nanocavity array), are able to both resonantly generate and tightly confine surface plasmon waves.

The application of surface plasmon enhancement in semiconductor devices has been previously examined in the context of metal nanoparticles and thin metallic interfacial layers. Enhancement of the optical field in the vicinity of metallic nanoparticles has been shown to increase absorption in both OPVs and silicon based photovoltaic cells. The field enhancement from metallic nanoparticles, however, is localized to within 5-10 nm and is difficult to control and optimize. Similar approaches have involved the use of energy transfer via surface plasmons created by an interfacial Ag film, with the surface plasmons acting as an antenna through which to excite a photoactive organic semiconductor. As is the case with metallic nanoparticles, the spectral response of this architecture is not easily tuned.

The present invention provides plasmonic OPVs where the spatial extent of the optical field can be tightly localized and the optical energy enhanced within a thin donor-acceptor OPV. The combination of local field enhancement near the patterned metallic anode and a strong field enhancement due to the plasmonic nanocavity provides integration of plasmonic nanostructures in semiconductor devices. The spectral response of this technique is highly tunable and broadly applicable in enhancing the optical absorption and overall power conversion efficiency ($\eta_P$) in photovoltaic systems in accordance with the present invention.

Figure 2:
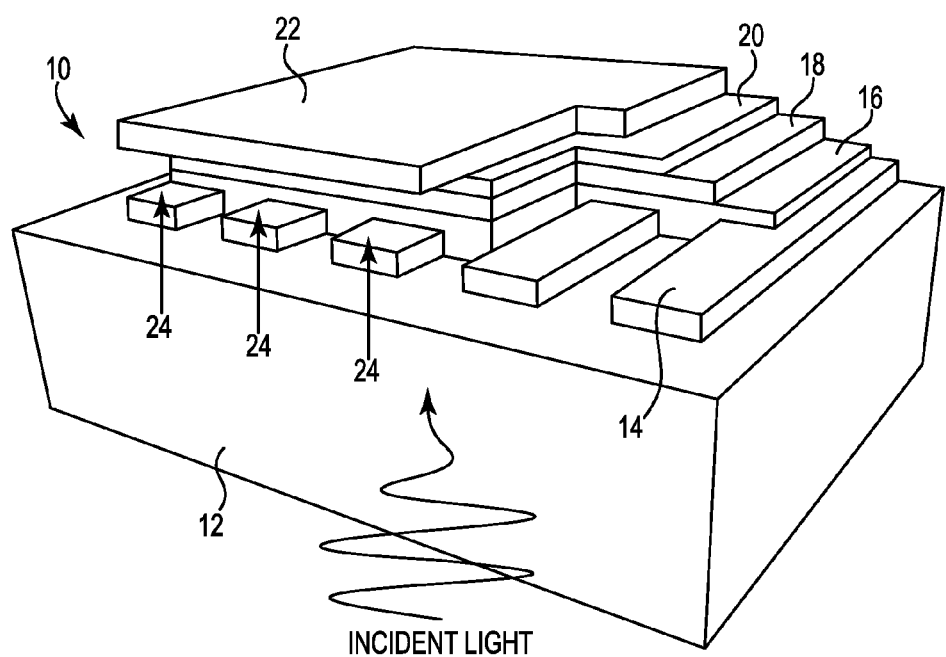
FIG. 2 is a partial cross-sectional perspective view of an exemplary device structure in accordance with the present invention.
Figure 3:
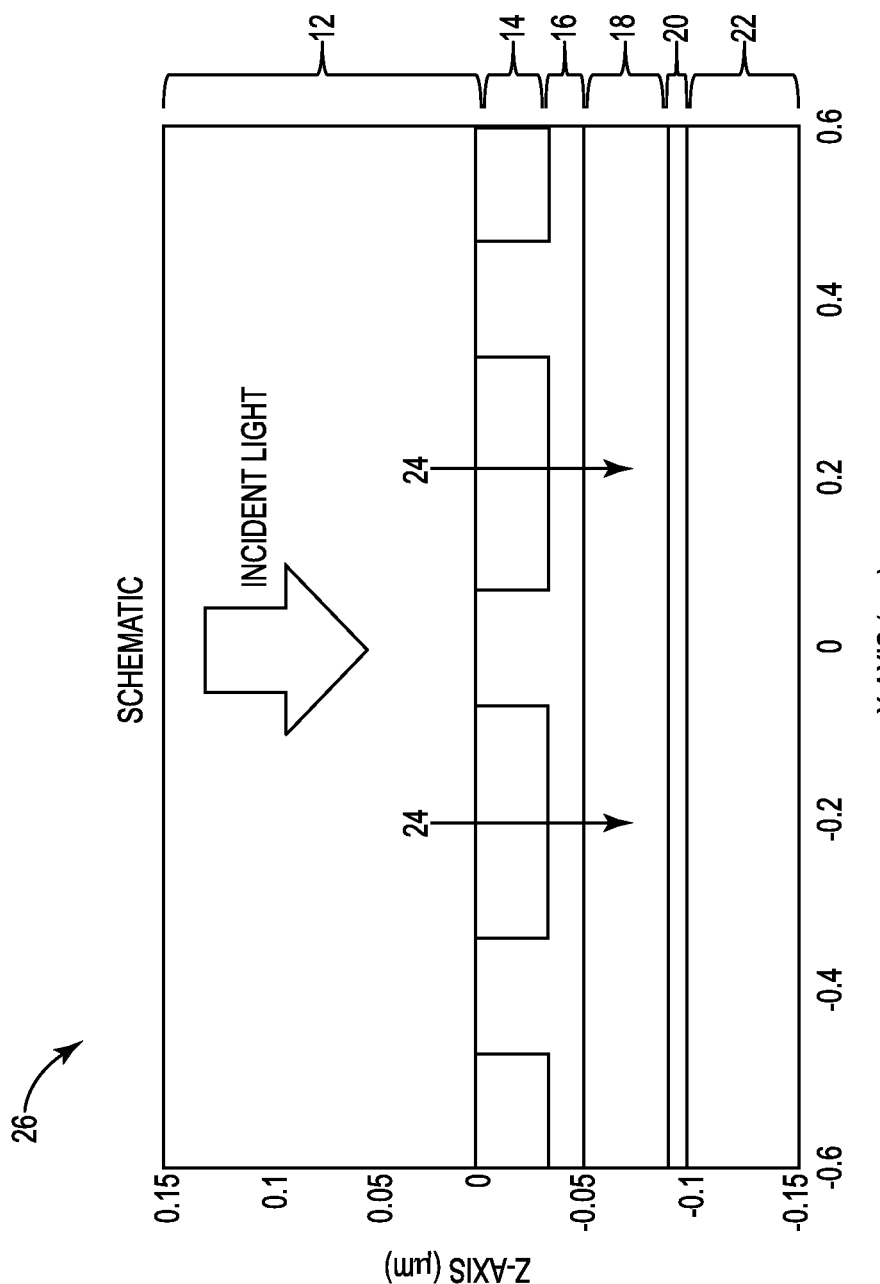
FIG. 3 is a schematic cross-sectional view of an exemplary device structure made in accordance with the exemplary device structure shown in FIG. 2.
Figure 4:
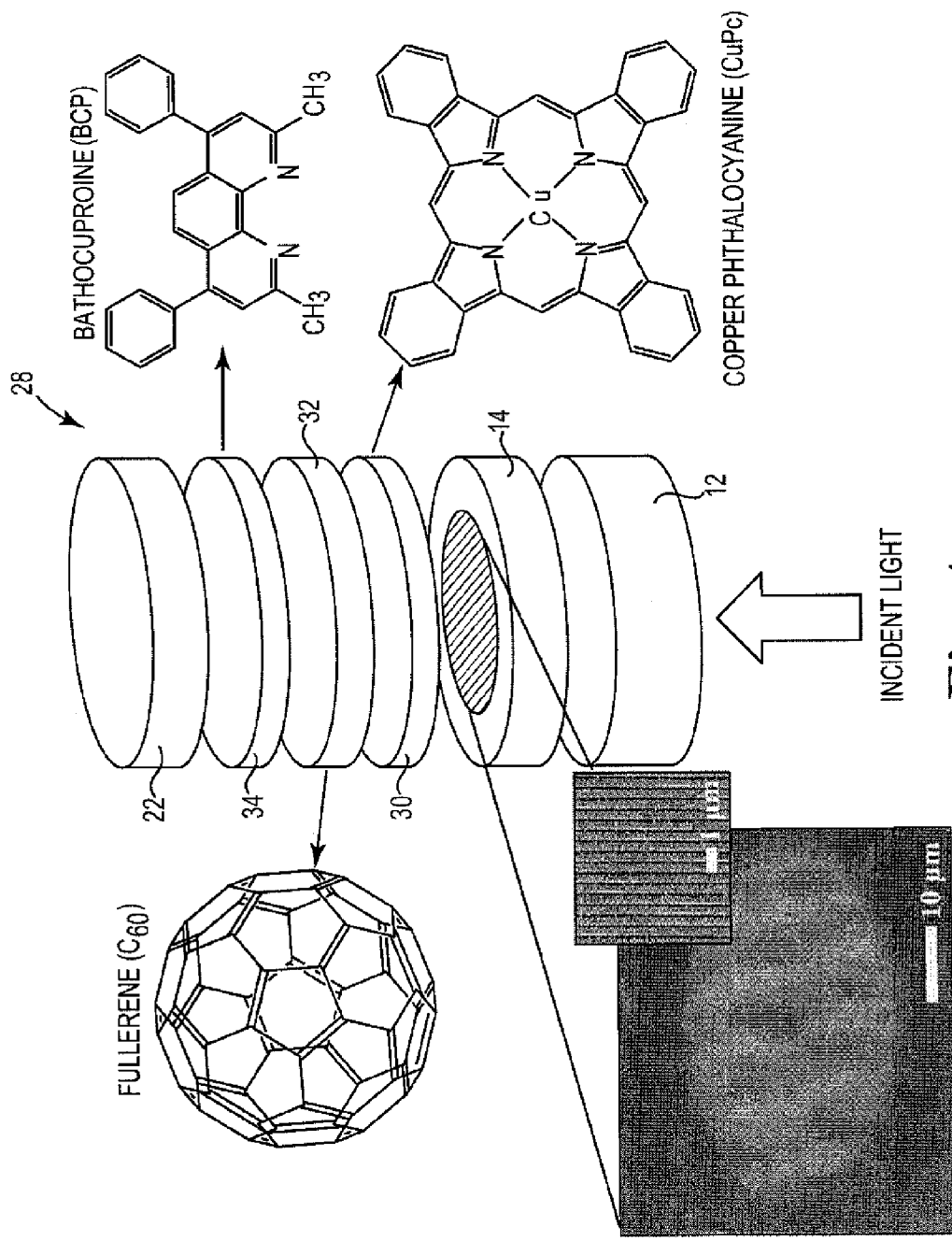
FIG. 4 is a schematic view of another exemplary device structure made in accordance with the exemplary device structure shown in FIG. 2.

Referring to FIGS. 2-4, an exemplary device structure is illustrated. In particular, FIG. 2 is a partial cross-sectional perspective view of an exemplary device structure in accordance with the present invention. FIG. 3 is a schematic cross-sectional view of an exemplary device structure made in accordance with the exemplary device structure shown in FIG. 2. FIG. 4 is a schematic view of another exemplary device structure made in accordance with the exemplary device structure shown in FIG. 2.

With reference to FIG. 2 initially, device structure 10 comprises substrate 12, patterned metallic anode 14, first organic layer 16, second organic layer 18, third organic layer 20, and metallic cathode 22. Patterned metallic anode 14 preferably comprises plasmonic nanocavities 24 as described in greater detail below. In FIG. 3, exemplary device structure 26 is consistent with exemplary device structure 10 of FIG. 2 and includes an exemplary scale in microns along the x-axis and the z-axis. Additionally, exemplary device structure 28 of FIG. 4 comprises a structure consistent with exemplary device structures 10 and 28. Device structure 28 includes exemplary organic layers comprising first organic layer 30 comprising copper phthalocyanine (CuPc), second organic layer 32 comprising $C_{60}$, and third organic layer 34 comprising bathocuproine.

An exemplary device structure in accordance with the present invention preferably comprises a glass substrate coated with a 30-nm-thick film of metal such as Ag. Subwavelength slits are preferably patterned into the Ag via focused ion beam (FIB) milling, thus defining the edges of the plasmonic nanocavities. In an exemplary embodiment such pattern includes a 50 μm diameter array of periodic slits with a period of 415 nm and width of 120 nm. The resulting exemplary plasmonic nanocavities thus have a width of 295 nm. The periodic array generates and sustains surface plasmon waves, which are channeled into the photoactive layers. In an exemplary embodiment organic semiconductor layers are preferably sequentially deposited onto the Ag film, and may comprise, for example, a 20-nm-thick film of copper phthalocyanine (CuPc) and a 40-nm-thick film of $C_{60}$. An optional 10-nm-thick film of bathocuproine (BCP) can be deposited on $C_{60}$ and preferably functions as an exciton blocking layer. In an exemplary embodiment, organic layers and the cathode are preferably deposited through a metal shadow mask that defines devices having a diameter of 115 μm. The structure is then preferably capped with a metallic cathode such as a 50-nm-thick Al layer, for example.

Device structures in accordance with the present invention are not limited to the exemplary materials listed. Anode and cathodes can include alternative metals. The organic layers can include any organic semiconducting materials that function as electron donors (ex. CuPc) and electron acceptors (ex. $C_{60}$). In addition to BCP as an exciton blocking layer, any material that functions to block excitons and still conduct charge can be used. Also, alternative substrates such as plastics and foils can be used be used instead of or in addition to glass substrates.

Exemplary structures described herein comprise planar photovoltaic devices, however the structures of the present invention can be used with bulk and mixed heterojunction devices. Other devices using nanocrystalline materials, semiconducting polymers, and polymer/nanoparticle combinations can also be incorporated.

Although certain dimensions, geometries, and periodicities are described herein, such as for the nanocavities, such parameters are exemplary. Devices including patterned contacts that cover any desired portion (including the complete active area) of the device can be made. The metallic contact that is patterned is not limited to the anode and the metallic cathode can also be patterned.

Figure 5:
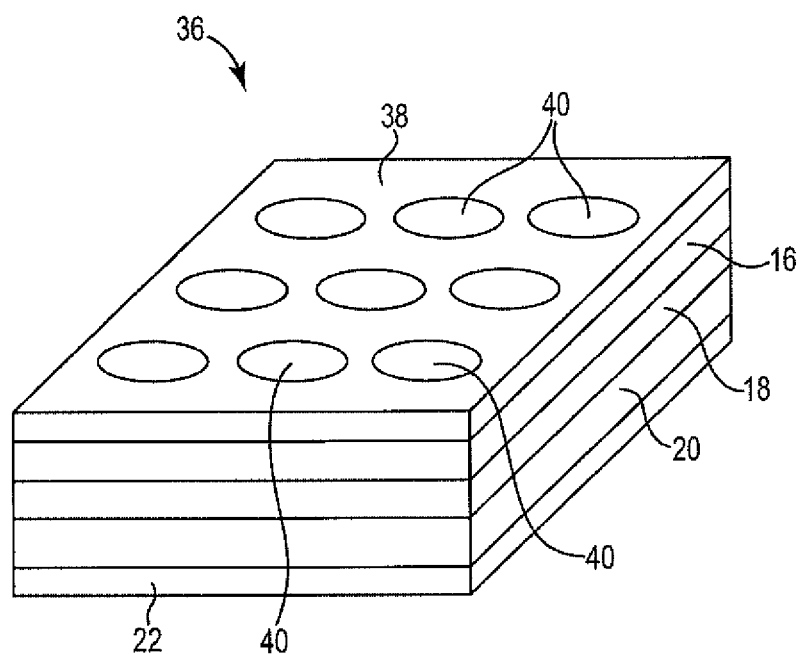
FIG. 5 is a schematic view of another exemplary device structure in accordance with the present invention showing in particular a patterned anode having an array of openings.

In FIG. 5 another exemplary device structure 36 in accordance with the present invention is schematically shown. Device structure 36 preferably comprises a patterned anode 38 having an array of openings 40. The array is preferably periodic but not required to be so. Any desired spacing can be used for the array. The openings are preferably circular but not required to be so. Any desired geometry can be used.

Figure 6:
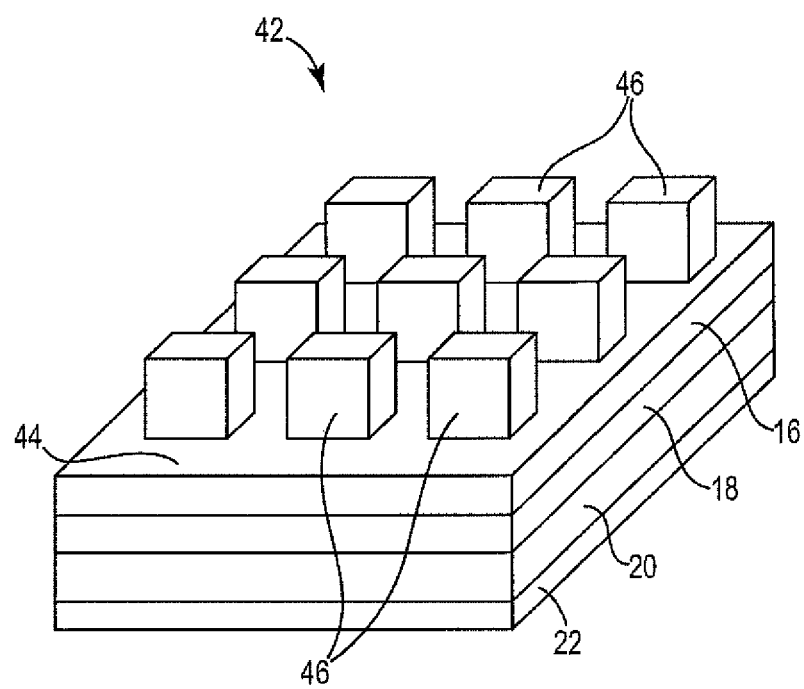
FIG. 6 is a schematic view of another exemplary device structure in accordance with the present invention showing in particular a patterned anode having an array of bumps.

In FIG. 6 another exemplary device structure 42 in accordance with the present invention is schematically shown. Device structure 42 preferably comprises a patterned anode 44 having an array of bumps 46. The array is preferably periodic but not required to be so. Any desired spacing can be used for the array. Any desired geometry for bumps 46 can be used.

Device performance for both patterned and unpatterned exemplary devices in accordance with the present invention under simulated AM1.5G solar illumination are shown in FIGS. 7 and 8. The dependence of the open-circuit voltage (VOC) and fill factor (FF) on illumination intensity (FIG. 7) are similar for both patterned and unpatterned devices. This indicates that the patterning of the anode does not detrimentally impact the collection of dissociated charge carriers in the device. Device dark currents were also noted to be independent of patterning. The $\eta_P$ increases with patterning by a factor of 3.2±0.4 under 118±12 mW/cm² illumination. This large increase is due to a similar increase in device responsivity (FIG. 8) as a result of the enhancement of the internal optical field, and the device absorption efficiency. The enhancement is independent of illumination intensity up to 500 mW/cm².

Figure 9:
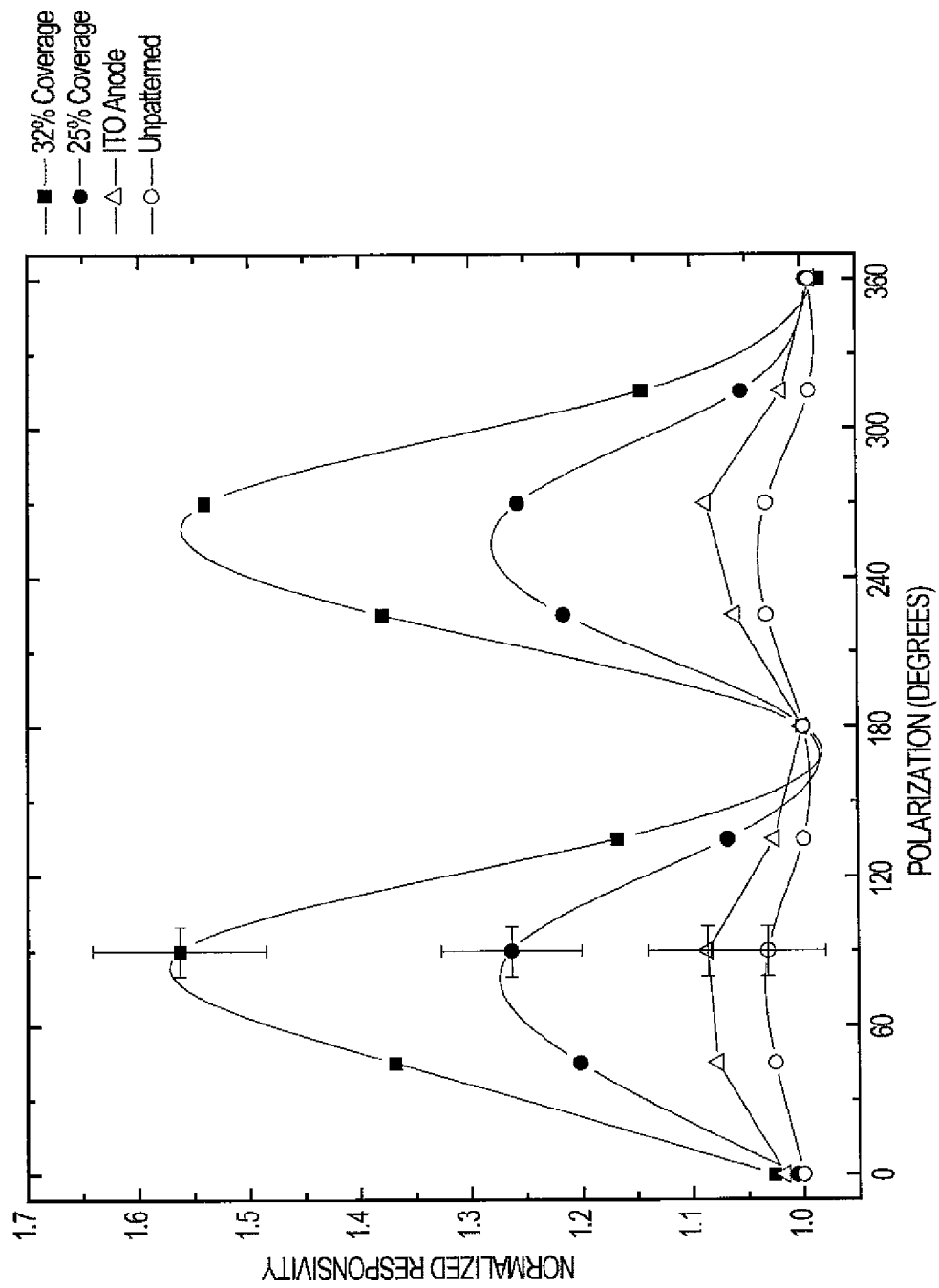
FIG. 9 is a graph that shows the polarization dependence of the photovoltaic response of exemplary devices in accordance with the present invention. Responsivity as a function of polarization is shown for devices having an anode including: unpatterned Ag (open circles), ITO (triangles), 50 μm diameter patterned Ag (circles) and 50 μm edge length patterned Ag (squares). The square pattern with a 50 μm edge has active area coverage of 32%, while the circular pattern with a 50 μm diameter has active area coverage of 25%. The larger coverage area leads to stronger polarization dependence and a larger overall increase in responsivity. The denoted error bars are representative on a fractional basis of all data points.

To confirm the role of the plasmonic nanocavities in enhancing $\eta_P$ in accordance with the present invention, the responsivity of exemplary devices was measured as a function of incident light polarization and can be seen in FIG. 9. For unpatterned devices, very little modulation with incident polarization was observed, with the in-phase to out-of-phase responsivities differing by 3.2%. For comparison, similar devices deposited on a glass slide pre-coated with indium tin oxide (ITO) as an anode also showed a weak modulation of 8.6% with incident light polarization.

Patterned substrates exhibited a very strong dependence on polarization, because the enhancement is greatest when the incident electric field is polarized perpendicular to the slit array (TM polarized). The modulation with polarization was observed to increase as the patterned device area was increased. Two exemplary configurations were examined: the first pattern had a diameter of 50 µm, while the second pattern was square with an edge length of 50 µm. In both cases, the device active area had a diameter of 115 µm. The observed responsivity enhancement with polarization for the square pattern (56.4%) was more than twice as large as that of the circular pattern (26.2%), consistent with the increase in patterned device from 25% to 32%.

Devices in accordance with an embodiment of the present invention preferably overcome the strong polarization dependence by utilizing a two-dimensional array of subwavelength apertures that couple to surface plasmon modes without exhibiting the intrinsic polarization-dependence of slits. Furthermore, certain geometries, such as plasmonic MIM cavities and void plasmon structures have omnidirectional absorption resonances that are independent of the incident angle and can be used with devices in accordance with the present invention.

The increase in optical field intensity within the OPV layers as a result of the plasmonic nanocavity array was quantified using finite-difference-time-domain (FDTD) simulations. Incident light from the glass side was TM polarized, to maximize the cavity response. To give a reasonable comparison to the efficiency enhancement seen in the experiments, only the optical energy that contributes to the photocurrent generation was numerically simulated, that is, the energy confined to roughly within a diffusion length of the CuPc/C$_{60}$ interface. ($L_{D,CuPc}$=10 nm and $L_{D,C60}$=40 nm).

Figure 10:
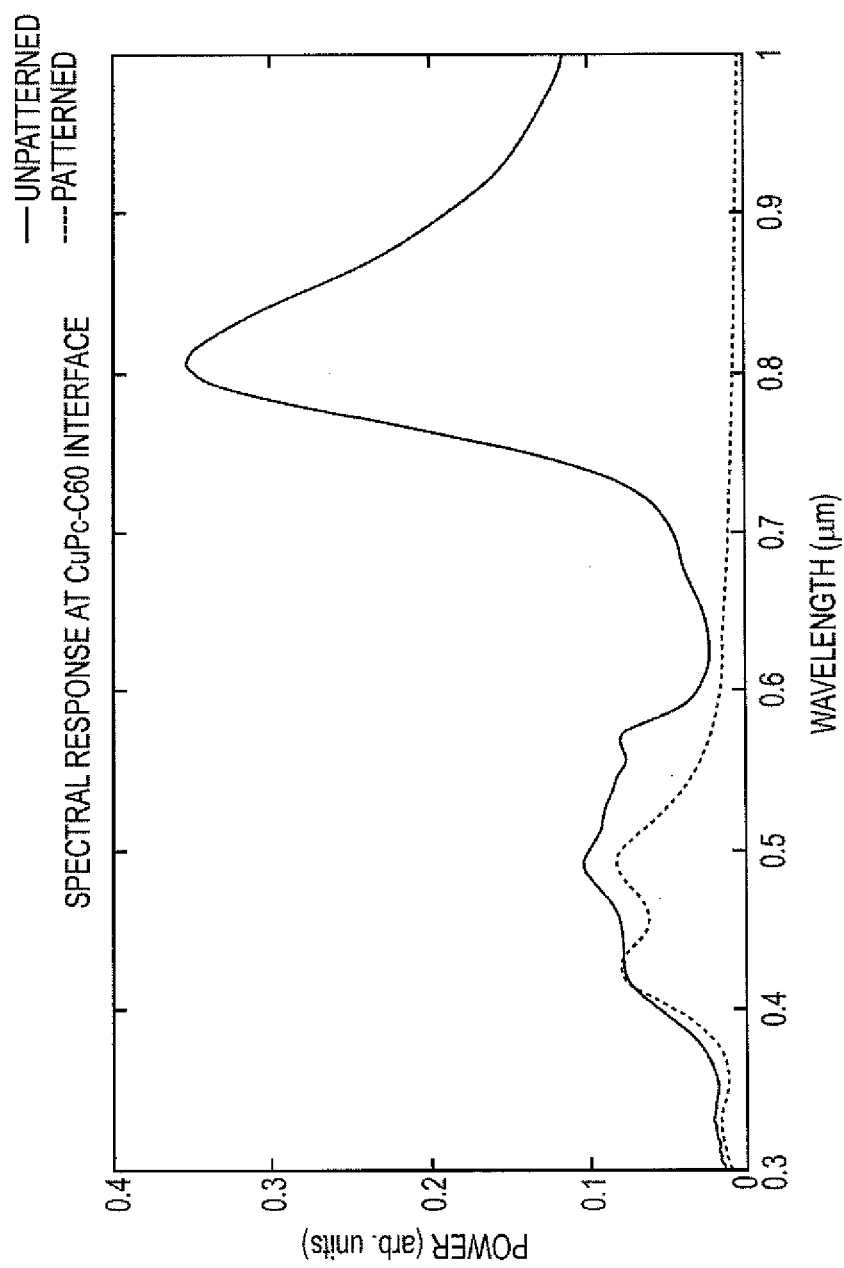
FIG. 10 is a graph that shows simulated spectral response and internal electric field distribution of exemplary devices in accordance with the present invention. Finite-Difference-Time-Domain calculations of the photovoltaic spectral response for both patterned and unpatterned Ag anodes is shown. A distinct plasmonic nanocavity array mode is seen at 805 nm.
Figure 11:
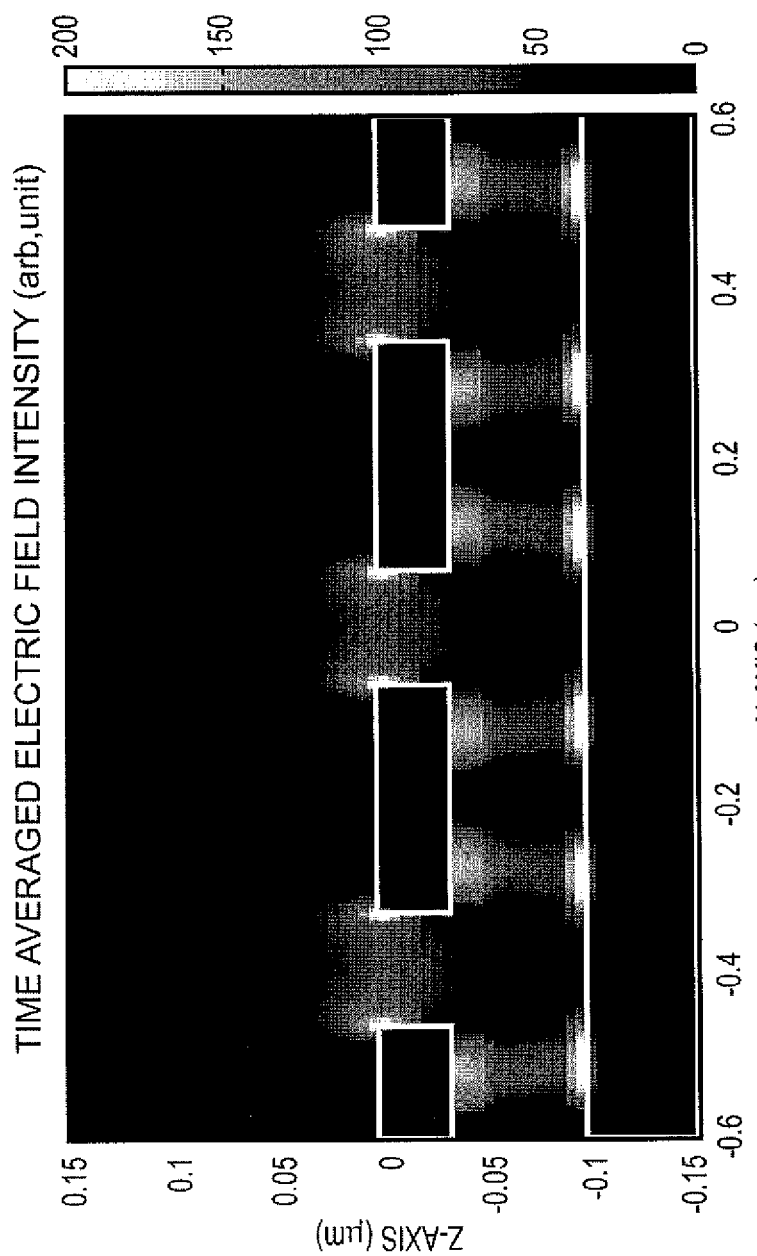
FIG. 11 is a graph that shows simulated time averaged electric field intensity of exemplary devices in accordance with the present invention. A map of the electric field distribution at the 805 nm resonance is shown. The optical energy is tightly confined and enhanced in the organic active layers as a surface plasmon standing wave between the patterned Ag anode and the Al cathode.

FIG. 10 shows the simulated spectral response for exemplary patterned and unpatterned devices. The strongest optical mode of the structure is at a wavelength of 805 nm. FIG. 11 maps the strong confinement and enhancement of the optical field within the organic layers at this resonance in the form of surface plasmon standing waves. As the incident light feeds the surface plasmon nanocavity mode, only 5% is reflected. A smaller resonance is observed at a wavelength of 570 nm. By patterning the metallic anode film and forming the plasmonic nanocavity array, a maximum enhancement of the optical intensity of around 50 is observed. Over the rest of the spectrum, a broadband enhancement between 2 to 4 times is observed, consistent with the attenuating nature of the unpatterned metallic anode, and the slits serving to open a fraction of the anode area.

Because the absorption losses are relatively low at the maximum surface plasmon nanocavity peak at 805 nm, a very well defined surface plasmon nanocavity mode is observed. This configuration was chosen in order to resolve the novel plasmonic nanocavity enhancement at 805 nm. Matching the resonances of the absorption to a strong surface plasmon nanocavity mode can maximize the efficiency enhancement, which can be partly achieved by tuning the periodicity of the patterned structure.

Figure 13:
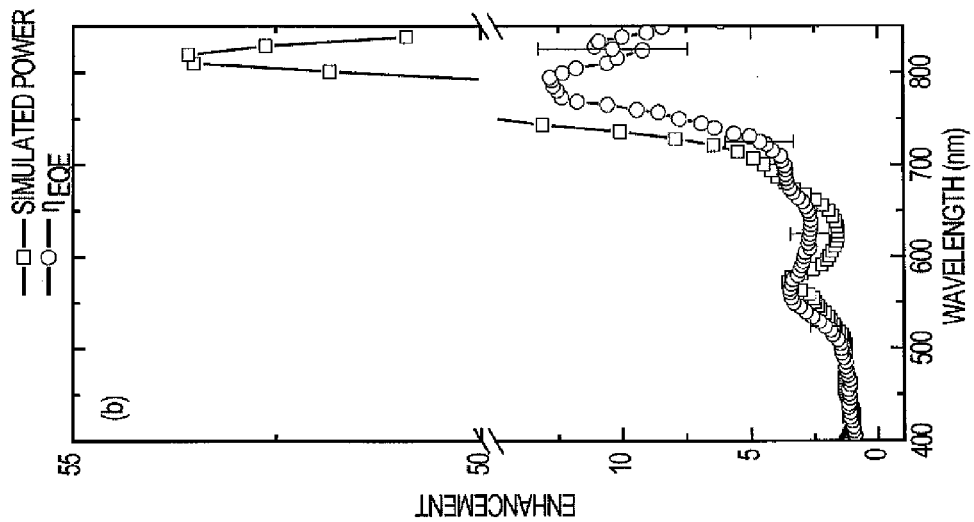
FIG. 13 is a graph that shows the ratio of patterned versus unpatterned ηEQE and simulated power enhancement inside an exemplary device in accordance with the present invention. The spectral features of the experimental data and simulation show close agreement with the simulation data having a slight red-shift for the large enhancement at 805 nm. The simulation enhancement at 805 nm is larger than the experimental data for reasons discussed below.
Figure 12:
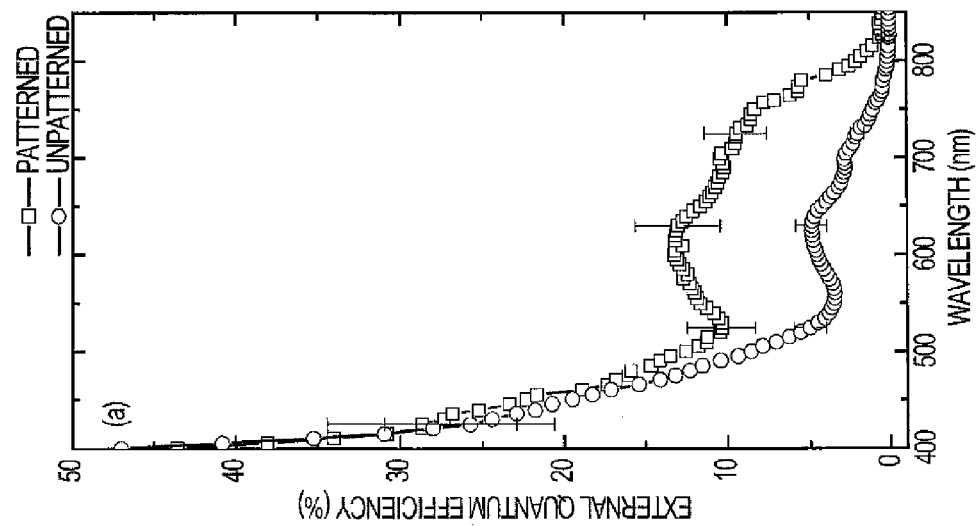
FIG. 12 is a graph that shows photovoltaic spectral response. External quantum efficiency (ηEQE) spectra for patterned and unpatterned devices. The increase in ηEQE at wavelengths greater than 500 nm is due to the enhanced light intensity in the device from the plasmonic nanocavity array.

Simulations of the spectral response of the structure were compared to external quantum efficiency ($\eta$EQE) spectra for the exemplary plasmonic nanocavity devices in accordance with the present invention. FIG. 12 shows the $\eta_{EQE}$ for both patterned and unpatterned devices, with patterned devices exhibiting a broadband enhancement in spectral response with particular emphasis at larger wavelengths. Because the $\eta_{EQE}$ depends proportionally on the absorption efficiency of the OPV, an enhancement in the internal field leads to an enhancement in the observed spectral response. Thus, the ratio of the $\eta_{EQE}$ between patterned and unpatterned devices is a measure of the relative increase in absorption efficiency, and the internal optical field. This ratio of patterned to unpatterned $\eta_{EQE}$ is shown in FIG. 13, and is compared to the FDTD simulation of the optical field enhancement in this nanostructure. The experimental spectral response is reproduced well in the simulation, with the most striking difference being the difference in the magnitude of the observed and predicted field enhancement. This difference arises because the simulation assumes that the entire device area is patterned, and that the incident light polarization is aligned for maximum response. Experimentally, the patterned area is only a fraction of the total device area, and the incident light is randomly polarized.

In an exemplary embodiment of the present invention anodes can be patterned through a self-assembly technique. In this exemplary process polymer beads such as those comprising polystyrene or the like are deposited onto a substrate such as glass, for example and organized in a uniform pattern through self-assembly. The beads are then reduced in size such as by etching, for example. A layer of metal, such as silver, for example, is then preferably deposited over the beads, after which the beads are removed to create a two-dimensional array of openings (typically holes) in the metal anode.

Figure 20:
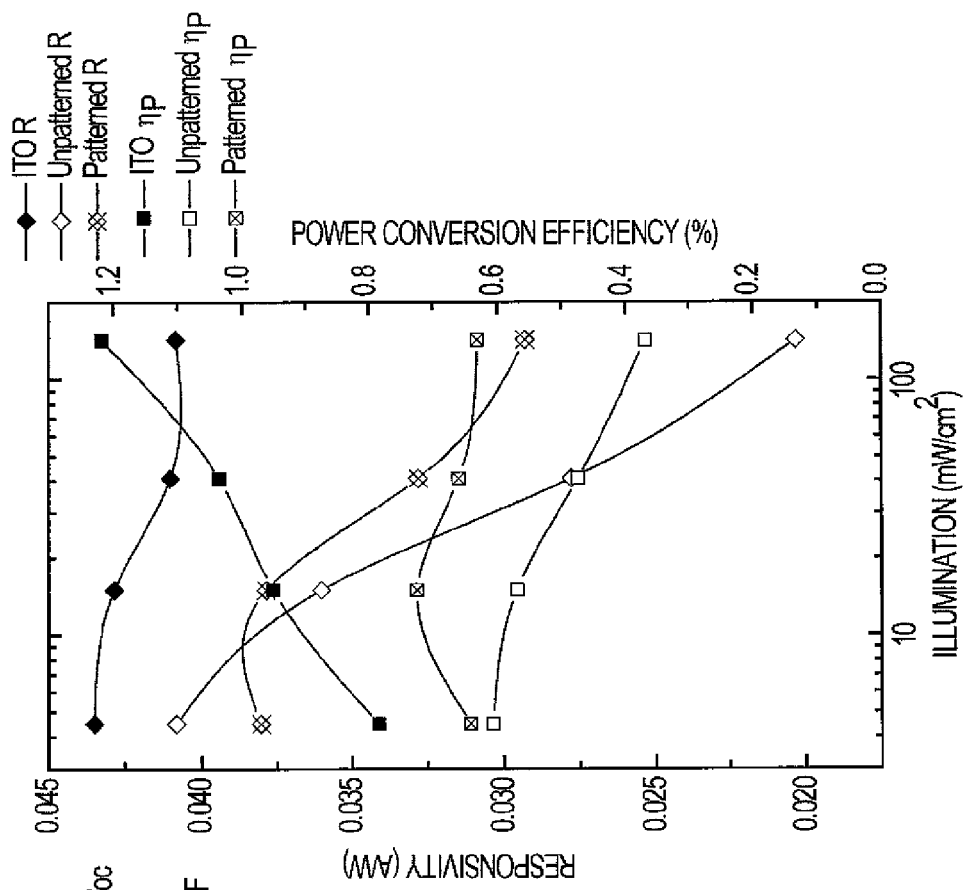
FIG. 20 is a graph showing device responsivity and efficiency for ITO, unpatterned silver, and patterned silver anode devices. The pattern consists of a two dimensional hole array created by a self assembly method.
Figure 19:
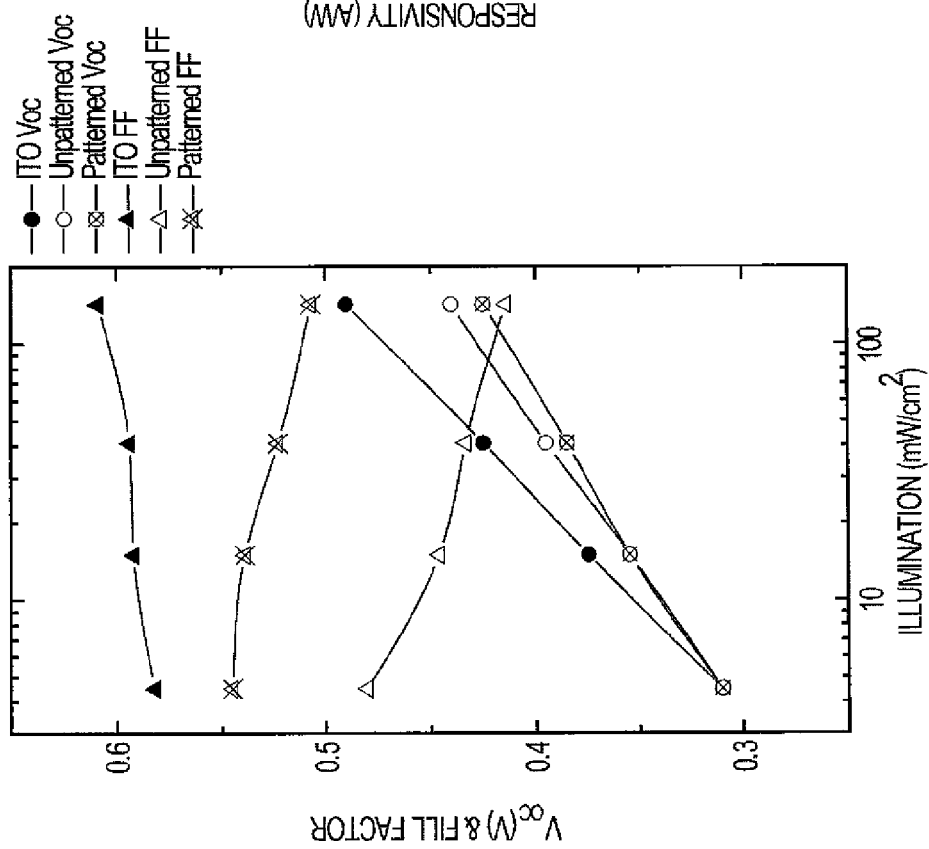
FIG. 19 is a graph showing the open circuit voltage and fill factor for devices with an ITO, unpatterned silver, and patterned silver anode. The pattern consists of a two dimensional hole array created by a self assembly method.

Devices in accordance with the present invention can be fabricated or otherwise provided on top of these substrates with performance of exemplary devices shown in FIGS. 19 and 20. FIG. 19 shows that devices comprising unpatterned and patterned silver have similar open circuit voltages. This demonstrates that anode patterning does not adversely affect device performance. Also shown in FIG. 19 is the improvement in fill factor of an exemplary device with a patterned anode. FIG. 20 demonstrates slight increases in device responsivity and efficiency for devices including a patterned anode. Both FIGS. 19 and 20 show that device performance with either silver anode is slightly lower but comparable to the performance of devices having an ITO anode.

In an embodiment of the present invention device efficiency can be increased by a factor of 3.2±0.4 by incorporating a plasmonic nanocavity array into the device architecture in accordance with the present invention. The use of a plasmonic nanocavity allows for thin organic semiconducting layers to efficiently harvest light without sacrificing absorption potential. With optimization of pattern design and materials selection further enhancements in efficiency are provided.

Optical Modeling

Figure 14:
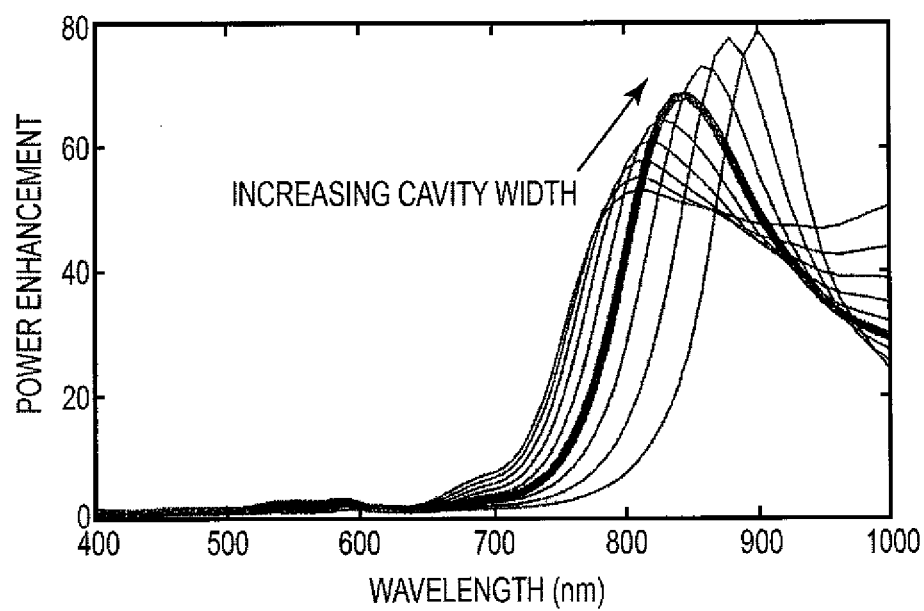
FIG. 14 is a graph that shows simulated spectral response for exemplary devices in accordance with the present invention having varying nanocavity width.
Figure 15:
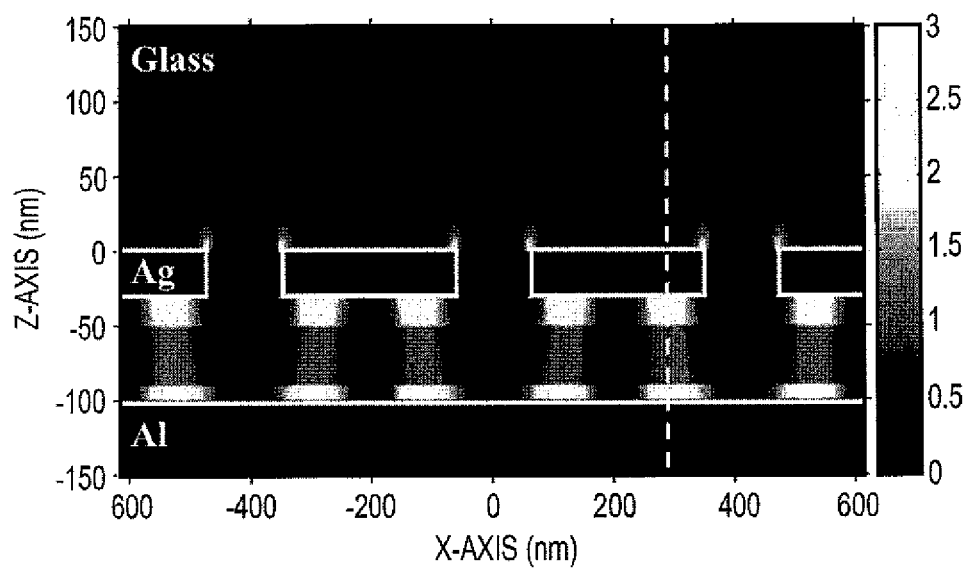
FIG. 15 is a graph that shows the time-averaged intensity of the plasmonic field within a nanocavity in accordance with the present invention.
Figure 16:
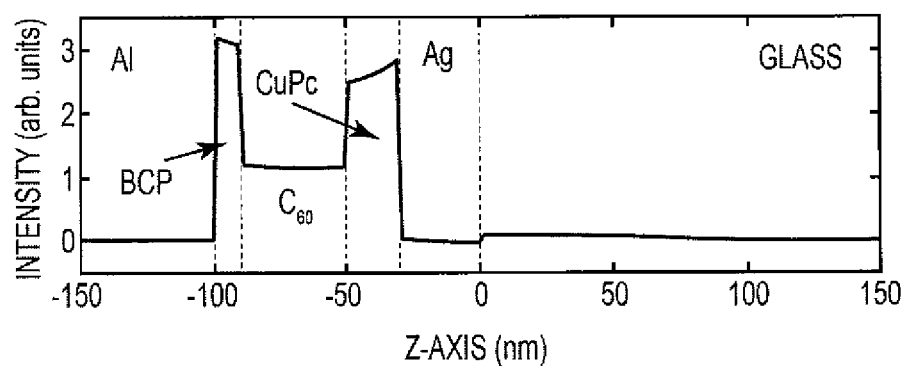
FIG. 16 is a graph that shows intensity of the plasmonic field of an exemplary device in accordance with the present invention.

Finite-difference-time-domain (FullWAVE™, RSoft Design Group) simulations were performed using an adaptive two-dimensional mesh, with a width of 400 nm and a length of 3000 nm. The mesh was periodic in its width, defining the periodicity of the plasmonic nanocavities (400 nm). Each nanocavity was 267 nm wide, leaving 133 nm wide slits. The adaptive mesh had a nominal grid spacing of 5 nm, a material interface grid spacing of 1 nm, and incorporated at least 15 grid points between each material interface. The complex dielectric functions of the exemplary Ag and Al films were modeled as having a Drude-Lorentz response. A non-linear least-squares fit of multiple Lorentzian oscillators was used to model the complex dielectric functions Finite-difference time-domain (FDTD) simulations were also used to aid in device design, optimization, and characterization. To offer a reasonable comparison to experimental results, only the optical power within a diffusion length of the $CuPc/C_{60}$ interface was numerically simulated (10 nm for CuPc, 40 nm for $C_{60}$). Material parameters were modeled with a non-linear least-squares fit of multiple Lorentzian oscillators to measured optical constants. Metals were simulated with a Lorentz-Drude model. FIG. 14 shows simulated spectral responses where the nanocavity width is changed from 199 nm to 359 nm, showing an easily tunable response near 800 nm. The nanocavity periodicity was fixed at 409 nm. The spectral response is also tunable (not shown) by changing the periodicity of the nanocavity arrays. The spectra are normalized to the response of an unpatterned device, showing significant power enhancement. The blackened spectrum has the cavity width of the fabricated device. On resonance, only about 7% of the incident light is reflected. A much less pronounced enhancement resonance, which occurs mainly on the Ag-glass interface, is seen near 575 nm. FIG. 15 shows the spatial field distribution of the nanocavity in the form of SP standing waves. Taking a vertical slice (dash), enhancement is seen through the thickness of the device layers, shown in FIG. 16.

Figure 17:
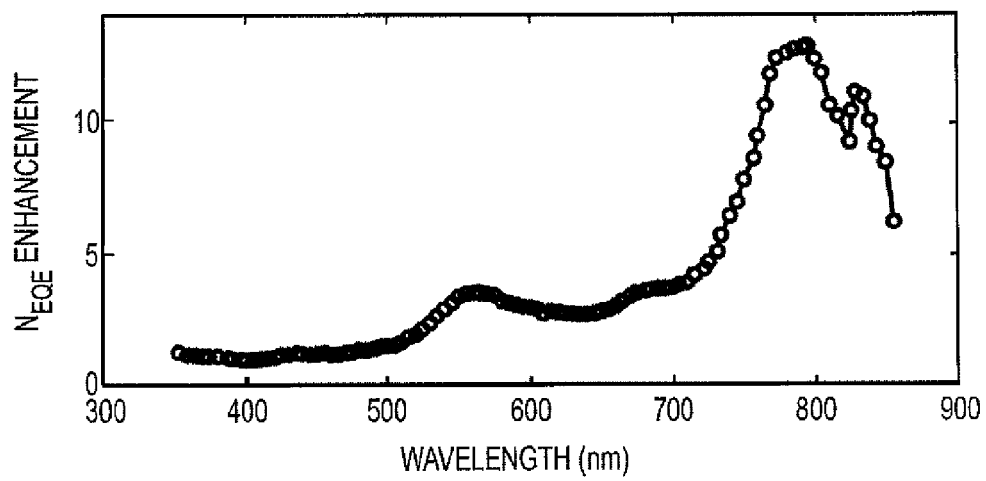
FIG. 17 is a graph that shows external quantum efficiency enhancement of an exemplary device in accordance with the present invention.
Figure 18:
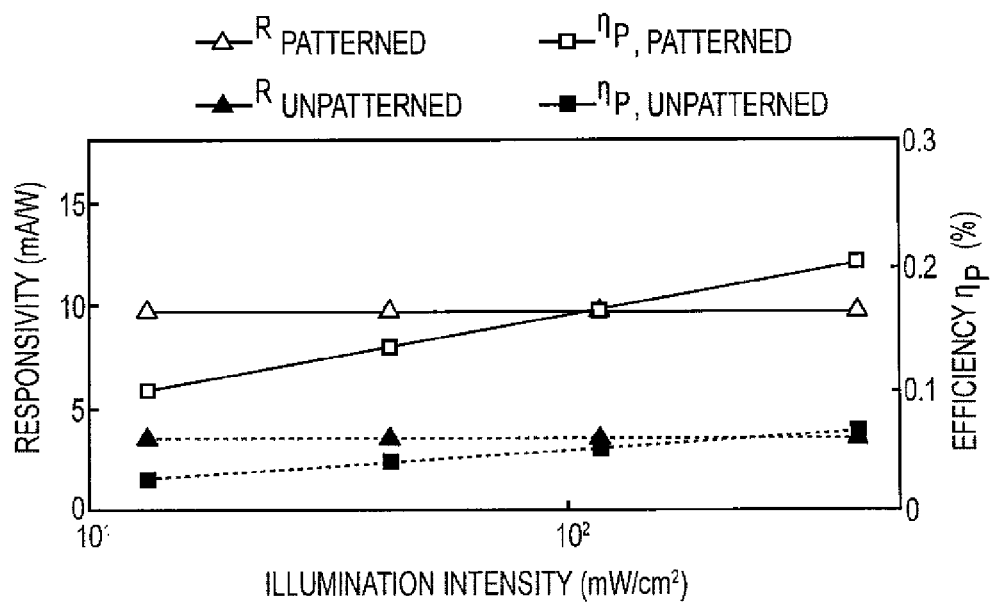
FIG. 18 is a graph showing the increase in responsivity and total power conversion efficiency for an exemplary device in accordance with the present invention.

The external quantum efficiency ($\eta_{EQE}$) depends proportionally on optical absorption efficiency. The ratio of $\eta_{EQE}$ for a patterned versus an unpatterned device is thus a measure of the relative internal optical field and efficiency enhancement. FIG. 17 shows the $\eta_{EQE}$ enhancement, agreeing well with FIG. 14, with peaks near 800 nm and 575 nm. This increase corresponds to a 2.75 fold increase in responsivity R and total power conversion efficiency $\eta_P$, shown in FIG. 18, overall efficiency increased by 3.2. Only 16% of the active area was patterned due to FIB milling limitations, however it is contemplated that the enhancement could be higher. Electrical properties such as open-circuit voltage, fill factor, and dark current magnitude were relatively unchanged, indicating that patterning did not adversely affect collection of dissociated charge carriers, and that the enhancement was an optical effect.

Device Fabrication

Exemplary devices were grown on glass substrates coated with a 30-nm-thick layer of Ag deposited by thermal evaporation at $10^{-7}$ Torr. Subwavelength periodic nanostructures were patterned into the Ag layer by focused ion beam milling. Prior to deposition of organic thin films, the Ag coated substrate was degreased with solvents. A shadow mask used to define the device active area was aligned on top of the patterned substrate using an optical microscope. The organic layers and Al cathode were deposited in direct succession without vacuum break by thermal evaporation at $3\times10^{-7}$ Torr. All organic materials were used as received. Devices were also grown on glass substrates pre-coated with a 140-nm-thick layer of indium tin oxide (ITO) having a sheet resistance of $\sim15\Omega/\square$ (Colorado Concept Coatings). These substrates were degreased with solvents and then cleaned with UV-ozone exposure prior to device growth. Although focused ion beam milling was used here to make the exemplary patterned nanocavities, any method to generate a patterned metallic contact can be used.

Exemplary nanocavities were fabricated having a width of 289 nm, a periodicity of 409 nm, and covering an area of 1661 $\mu m^2$. In an embodiment of the present invention an exemplary device comprised a total area of 10381 $\mu m^2$. Simulated solar illumination (AM1.5G) incident from the glass side excited surface plasmons on the slits, which were resonantly fed into the nanocavities, increasing absorption and overall power conversion efficiency. The plasmonic enhancement was quantified by making reference devices where the metallic anode was not patterned.

Device Characterization

Exemplary devices were tested under broadband optical excitation using a solar simulator (Newport Model 96000) with an Air Mass 1.5 Global filter. Incident light was focused onto a testing plate having a 1.5 mm diameter aperture. The incident light intensity was measured using a Newport 818P-010-12 High-Power Detector. Current-voltage sweeps were performed with an Agilent Technologies 4155C Semiconductor Parameter Analyzer. The external quantum efficiency was measured using a 100 W Xenon arc lamp (Newport Model 6257) and an Oriel cornerstone 130 1/8m monochromator. The incident light intensity was measured as a function of wavelength using a Newport 818-UV Low Power detector. To improve the photocurrent signal-to-noise ratio, the incident light was chopped with a Stanford Research Systems (SRS) SR540 Optical Chopper at a frequency of 200 Hz and the current was input into an SRS SR570 low-noise current preamplifier and measured using an SRS SR810 DSP lock-in amplifier. In all Figures containing device characterization data, error bars are calculated based on the statistical variation in device-to-device performance.

REFERENCES

The following references are each entirely incorporated by reference herein in for all purposes.
1. Gaudiana, R. & Brabec, C. Organic materials: Fantastic plastic. Nature Photon. 2, 287-289 (2008).
2. Shaheen, S. E., Ginley, D. S. & Jabbour, G. E. Organic-Based Photovoltaics: Toward Low-Cost Power Generation. MRS Bull. 30, 10-19 (2005).
3. Pope, M. & Swenberg, C. in Electronic Processes in Organic Crystals (Oxford University Press, New York, 1982).
4. Gregg, B. A. The Photoconversion Mechanism of Excitonic Solar Cells. MRS Bull. 30, 20-22 (2005).
5. Peumans, P., Yakimov, A. & Forrest, S. R. Small molecular weight organic thin-film photodetectors and solar cells. J. Appl. Phys. 93, 3693-3723 (2003).
6. Halls, J. J. M. et al. Efficient photodiodes from interpenetrating polymer networks. Nature 376, 498-500 (1995).
7. Yu, G., Gao, J., Hummelen, J. C., Wudl, F. & Heeger, A. J. Polymer Photovoltaic Cells: Enhanced Efficiencies via a Network of Internal Donor-Acceptor Heterojunctions. Science 270, 1789-1791 (1995).

8. Peumans, P., Uchida, S. & Forrest, S. R. Efficient bulk heterojunction photovoltaic cells using small-molecular-weight organic thin films. Nature 425, 158-162 (2003).
9. Xue, J., Rand, B. P., Uchida, S. & Forrest, S. R. A Hybrid Planar-Mixed Molecular Heterojunction Photovoltaic Cell. Adv. Mater. 17, 66-71 (2005).
10. Shao, Y. & Yang, Y. Efficient Organic Heterojunction Photovoltaic Cells Based on Triplet Materials. Adv. Mater. 17, 2841-2844 (2005).
11. Ritchie, R. H. Plasma Losses by Fast Electrons in Thin Films. Phys. Rev. 106, 874-881 (1957).
12. Hutley, M. C. & Maystre, D. The total absorption of light by a diffraction grating. Opt. Commun. 19, 431-436 (1976).
13. Zia, R., Selker, M. D., Catrysse, P. B. & Brongersma, M. L. Geometries and materials for subwavelength surface plasmon modes. J. Opt. Soc. Am. A 21, 2442-2446 (2004).
14. Collin, S., Pardo, F., Teissier, R. & Pelouard, J. Efficient light absorption in metal-semiconductor-metal nanostructures. Appl. Phys. Lett. 85, 194-196 (2004).
15. Ebbesen, T. W., Lezec, H. J., Ghaemi, H. F., Thio, T. & Wolff, P. A. Extraordinary optical transmission through sub-wavelength hole arrays. Nature 391, 667-669 (1998).
16. Astilean, S., Lalanne, P. & Palamaru, M. Light transmission through metallic channels much smaller than the wavelength. Opt. Commun. 175, 265-273 (2000).
17. Stenzel, O., Stendal, A., Voigtsberger, K. & von Borczyskowski, C. Enhancement of the photovoltaic conversion efficiency of copper phthalocyanine thin film devices by incorporation of metal clusters. Sol. Energy Mater. Sol. Cells 37, 337-348 (1995).
18. Westphalen, M., Kreibig, U., Rostalski, J., Lüth, H. & Meissner, D. Metal cluster enhanced organic solar cells. Sol. Energy Mater. Sol. Cells 61, 97-105 (2000).
19. Rand, B. P., Peumans, P. & Forrest, S. R. Long-range absorption enhancement in organic tandem thin-film solar cells containing silver nanoclusters. J. Appl. Phys. 96, 7519-7526 (2004).
20. Tvingstedt, K., Persson, N., Inganas, O., Rahachou, A. & Zozoulenko, I. V. Surface plasmon increase absorption in polymer photovoltaic cells. Appl. Phys. Lett. 91, 113514 (2007).
21. Morfa, A. J. et al. Plasmon-enhanced solar energy conversion in organic bulk heterojunction photovoltaics. Appl. Phys. Lett. 92, 013504 (2008).
22. Schaadt, D. M., Feng, B. & Yu, E. T. Enhanced semiconductor optical absorption via surface plasmon excitation in metal nanoparticles. Appl. Phys. Lett. 86, 063106 (2005).
23. Pillai, S., Catchpole, K. R., Trupke, T. & Green, M. A. Surface plasmon enhanced silicon solar cells. J. Appl. Phys. 101, 093105 (2007).
24. Lim, S. H., Mar, W., Matheu, P., Derkacs, D. & Yu, E. T. Photocurrent spectroscopy of optical absorption enhancement in silicon photodiodes via scattering from surface plasmon polaritons in gold nanoparticles. J. Appl. Phys. 101, 104309 (2007).
25. Heidel, T. D., Mapel, J. K., Singh, M., Celebi, K. & Baldo, M. A. Surface plasmon polariton mediated energy transfer in organic photovoltaic devices. Appl. Phys. Lett. 91, 093506 (2007).
26. Rand, B. P. et al. Organic Double-Heterostructure Photovoltaic Cells Employing Thick Tris(acetylacetonato)ruthenium(III) Exciton-Blocking Layers. Adv. Mater. 17, 2714-2718 (2005).
27. Shin, H., Yanik, M. F., Fan, S., Zia, R. & Brongersma, M. L. Omnidirectional resonance in a metal-dielectric-metal geometry. Appl. Phys. Lett. 84, 4421-4423 (2004).
28. Teperik, T. V. et al. Omidirectional absorption in nanostructured metal surfaces. Nature Photon. 2, 299-301 (2008).
29. W. L. Barnes, A. Dereux, and T. W. Ebbesen, "Surface plasmon subwavelength optics," Nature, vol. 424, pp. 824-830, 2003.
30. H.T. Miyazaki, and Y. Kurokawa, "Squeezing Visible Light Waves into a 3-nm-Thick and 55-nm-Long Plasmon Cavity." Phys. Rev. Lett., vol. 96, 097401 (2006).

The present invention has now been described with reference to several exemplary embodiments thereof. The entire disclosure of any patent or patent application identified herein is hereby incorporated by reference for all purposes. The foregoing disclosure has been provided for clarity of understanding by those skilled in the art. No unnecessary limitations should be taken from the foregoing disclosure. It will be apparent to those skilled in the art that changes can be made in the exemplary embodiments described herein without departing from the scope of the present invention. Thus, the scope of the present invention should not be limited to the exemplary structures and methods described herein, but only by the structures and methods described by the language of the claims and the equivalents of those claimed structures and methods.

What is claimed is:

1. A photovoltaic device for converting incident light to electrical current comprising:
    a substrate;
    a metal anode layer, the metal anode layer defining an array within the metal anode layer of subwavelength apertures;
    an active region comprising one or more layers of semiconductor material; and
    a metal cathode layer,
    wherein a device architecture is provided with the active region located between the metal anode layer and the metal cathode layer, the device architecture of the active region, the metal anode layer and the metal cathode layer creating an array of plasmonic nanocavities within the spacing between the metal anode and metal cathode layers with respect to one another and optical coupling of the anode and cathode layers with one another, and further wherein edges of the plasmonic nanocavities are defined by the subwavelength apertures of the metal anode layer.

2. The photovoltaic device of claim 1, wherein at least one of the one or more layers of semiconductor material comprises an organic semiconductor.

3. The device of claim 1, wherein the metal anode comprises silver.

4. The device of claim 1, wherein the metal cathode comprises aluminum.

5. A method of increasing optical field intensity within an active region of an organic photovoltaic device, the method comprising:
    providing an organic photovoltaic device comprising a substrate, a metal anode layer defining an array within the metal anode layer of subwavelength apertures, an active region comprising one or more layers of organic semiconductor material; and a metal cathode layer, wherein a device architecture is provided with the active region located between the metal anode layer and the metal cathode layer, the device architecture of the active region, the metal anode layer and the metal cathode layer creating an array of plasmonic within the spacing between the metal anode and metal cathode layers with respect to one another and optical coupling of the anode and cathode layers with one another, and further wherein edges of the plasmonic nanocavities are defined by the subwavelength apertures of the metal anode layer;

generating and sustaining surface plasmon waves with the array of plasmonic nanocavities; and channeling the surface plasmon waves within the active region.

6. A method of making an organic photovoltaic device, the method comprising:

providing a substrate;

depositing an anode layer on the substrate;

forming an array of subwavelength apertures in the anode layer;

forming an active region onto the substrate and anode layer combination, the active region having one or more layers of organic semiconductor material; and forming a metal cathode layer over the active region to create a device architecture of the active region, the metal anode layer and the metal cathode layer with the active region located between the metal anode layer and the metal cathode layer, the device architecture of the active region, the metal anode layer and the metal cathode layer creating an array of plasmonic nanocavities within the spacing between the metal anode and metal cathode layers with respect to one another and optical coupling of the anode and cathode layers with one another, and further wherein edges of the plasmonic nanocavities are defined by the subwavelength apertures of the metal anode layer.

\* \* \* \* \*

UNITED STATES PATENT AND TRADEMARK OFFICE
CERTIFICATE OF CORRECTION

| | | |
|---|---|---|
| PATENT NO. | : 8,802,965 B2 | Page 1 of 1 |
| APPLICATION NO. | : 12/586383 | |
| DATED | : August 12, 2014 | |
| INVENTOR(S) | : Lindquist et al. | |

It is certified that error appears in the above-identified patent and that said Letters Patent is hereby corrected as shown below:

In the Specification

Column 1, line 56: "the'optical" should be -- the optical --

Signed and Sealed this
Twenty-fifth Day of November, 2014

Michelle K. Lee
*Deputy Director of the United States Patent and Trademark Office*